United States Patent
Strolle et al.

[11] Patent Number: 5,872,815
[45] Date of Patent: Feb. 16, 1999

[54] APPARATUS FOR GENERATING TIMING SIGNALS FOR A DIGITAL TELEVISION SIGNAL RECEIVER

[75] Inventors: Christopher Hugh Strolle, Glenside, Pa.; Tianmin Liu, Lawrenceville; Steven Todd Jaffe, Freehold, both of N.J.

[73] Assignee: Sarnoff Corporation, Princeton, N.J.

[21] Appl. No.: 602,943

[22] Filed: Feb. 16, 1996

[51] Int. Cl.⁶ .............................. H03D 1/00; H04L 27/22
[52] U.S. Cl. ...................... 375/321; 375/326; 375/343; 375/344; 348/726; 348/537; 329/304
[58] Field of Search ........................... 375/321, 326–327, 375/343–345, 350, 355; 348/725–726, 537; 329/304, 307–308

[56] References Cited

U.S. PATENT DOCUMENTS

| | | | |
|---|---|---|---|
| 4,422,175 | 12/1983 | Bingham et al. | 375/232 |
| 4,985,900 | 1/1991 | Rhind et al. | 375/226 |
| 5,090,024 | 2/1992 | Vander Mey et al. | 375/343 X |
| 5,276,711 | 1/1994 | Rossi | 375/355 |
| 5,282,019 | 1/1994 | Basile et al. | 358/12 |
| 5,309,482 | 5/1994 | Wright et al. | 375/343 X |
| 5,471,508 | 11/1995 | Koslov | 375/344 |
| 5,483,369 | 1/1996 | Darcie et al. | 359/126 |
| 5,513,221 | 4/1996 | Parr et al. | 375/344 |
| 5,517,526 | 5/1996 | Caudron et al. | 375/232 |
| 5,524,126 | 6/1996 | Clewer et al. | 375/355 |
| 5,539,782 | 7/1996 | Shin et al. | 375/355 |
| 5,548,617 | 8/1996 | Parel et al. | 375/316 |
| 5,581,585 | 12/1996 | Takatori et al. | 375/376 |
| 5,588,025 | 12/1996 | Strolle et al. | 375/316 |
| 5,604,741 | 2/1997 | Samueli et al. | 370/402 |
| 5,661,528 | 8/1997 | Han | 348/607 |

*Primary Examiner*—Young T. Tse
*Attorney, Agent, or Firm*—William J. Burke

[57] ABSTRACT

A QAM/VSB digital receiver is disclosed which includes a source of a QAM/VSB signal. An analog-to-digital converter is coupled to the QAM/VSB signal source, and is further responsive to a sample clock signal. A filter/complement is coupled to the analog-to-digital converter and has a first output terminal which produces a low-pass filtered QAM/VSB signal, and a second output terminal which produces a high-pass filtered QAM/VSB signal complementary to the low-pass filtered QAM/VSB signal. A sample clock generating circuit is coupled to the second output terminal of the filter/complement and produces the sample clock signal in response to the high-pass filtered QAM/VSB signal.

21 Claims, 5 Drawing Sheets

APPARATUS FOR GENERATING TIMING SIGNALS FOR A DIGITAL TELEVISION SIGNAL RECEIVER

The present invention relates to a receiver which may be used to receive digital signals modulated in either vestigial sideband (VSB) or quadrature amplitude modulation (QAM) or other similar modulation techniques.

BACKGROUND OF THE DISCLOSURE

Digital data transmission is becoming more and more important. In a digital data transmission system, a transmitted digital signal contains a sequence of encoded symbols each of which represents a predetermined number of data bits in the digital signal. One known method for coding such symbols is QAM, in which successive groups of bits (e.g. six or seven bits) are encoded into corresponding symbols. Each such symbol is represented by a complex signal, including an in-phase (or real) component I, and a quadrature (or imaginary) component Q. The value of this complex signal is one of a corresponding number (e.g. 64 or 128, respectively) of predetermined locations on the complex plane, called a constellation. This complex signal is then modulated onto the RF carrier. Other coding methods are known, including digital vestigial sideband (VSB) modulation, staggered QAM modulation, and quadrature phase shift keyed (QPSK) modulation. Digital signal receivers must be capable of receiving a digital signal, as described above, processing that signal, and reproducing the information represented by that signal, or storing that signal, e.g. on a magnetic tape, for reproduction at a later time. For example, television signals transmitted as a digital signal will soon supplement, and eventually replace, the analog television signals transmitted today. Television receivers will have to be able to receive digitally transmitted signals in any of the possible formats described above.

One aspect of digital receiver design is the synchronization of the receiver's sample clock to that of the transmitter; a process known as timing recovery. Several techniques exist for this synchronization. Conventional quadrature amplitude modulation (QAM) techniques include the use of a squaring loop. In this technique, the magnitude of the output signal from a sampling analog-to-digital converter is squared and bandpass filtered. This signal controls a phase locked loop, which in turn controls the phase and frequency of the receiver sampling clock for the analog-to-digital converter via a loop filter and voltage-controlled oscillator. This technique suffers deteriorating performance due to the presence of data noise in the loop. In addition, in the case of very dense constellations, the data modulation can completely mask the timing data and cause the synchronization circuit to fail to acquire and/or maintain synchronization.

Another synchronization technique is commonly known as band edge timing recovery. This technique is suitable for QAM constellations of any density, and with some modification may also be used with staggered QAM and VSB modulation. This technique operates independently of the QAM data carrier signal. Thus, timing may be recovered using this technique in the cresence of data carrier phase and frequency offsets. However, this technique tends to have a jitter component when it locks. To implement this technique for QAM requires only real filters, meaning that the filters processing the real and imaginary components operate independently of each other. However for VSB and staggered QAM, the filters required to implement this technique are analytic filters, meaning that they simultaneously process both real and imaginary components of a complex signal. The implementation of such filters requires four filter sections, which is a relatively complex implementation.

Synchronization techniques for QPSK modulated signals and for QAM modulated signals which are jitter-free are known. These techniques also operate independently of the QAM data carrier signal. In addition, these techniques use real filters which operate on the real and imaginary components independently, thus requiring only two filter sections. However, these techniques are not extensible to other forms of linear modulation, such as staggered QAM or VSB.

A timing recover technique is desirable which can provide jitter-free timing recovery, using real filters, and which can operate on signals using all forms of linear amplitude and/or phase modulation.

Another aspect of digital receiver design concerns the initial acquisition of a digital signal. This condition occurs whenever power is applied to the receiver, or when a new signal is tuned, e.g. the user changes the channel. When this condition occurs, the receiver must adapt to a new digital signal. One adaptation which must be made is the readjustment of the coefficients in the adaptive equalizer, which is used to compensate for channel characteristics, to a different channel path. Another adaptation which must be made is the recovery of the phase and frequency of the data carrier signal on which the digital data representing the digital signal is modulated (for example, the carrier of the QAM modulation, described above).

When the receiver is first turned on, or, for the example of a digital television receiver, when a new channel is selected by the viewer, the coefficients in the adaptive equalizer must be properly adjusted during the initial signal acquisition period. The adaptive equalizer compensates for channel characteristics and also suppresses intersymbol interference. In some digital transmission systems, a training sequence, i.e. a symbol sequence known to the receiver, is transmitted and the received signal is compared to the ideal signal representing the training sequence. On the basis of the received training sequence signal, the coefficients in the adaptive equalizer are adjusted so that the ideal training sequence signal is accurately reproduced at the receiver.

However, in other digital transmission systems, for example, in most digital television systems, it is not possible to use a training sequence to initially adjust the coefficients in the adaptive equalizer. Instead the actual received data signal must be used to adjust the adaptive equalizer coefficients, a process known as blind equalization. One known technique for adjusting the adaptive equalizer coefficients during the signal acquisition period is the constant modulus algorithm (CMA) technique. The CMA technique does not depend on decisions to operate, thus, accurate decisions are neither required, nor produced when the CMA technique is used.

The adaptive equalizer consists of two sections: a feed-forward equalizer (FFE), which is coupled in series with the signal processing path; and a decision feedback equalizer (DFE), which normally processes decisions made by the quantizer, and is coupled in a feedback path from the output of the quantizer to a signal combiner at the output of the FFE. During the initial signal acquisition period, the CMA algorithm neither depends on, nor produces accurate decisions. Thus, two problems arise in adjusting the coefficients of the DFE during the signal acquisition period. First, what data should be supplied to the DFE during this period. Second, how can the coefficients of the DFE be adjusted when accurate decisions are not available to be fed to the DFE.

In one known method for adjusting the DFE coefficients, the FFE is rearranged to cover both its own time delay range and that of the DFE. This is done by moving the center tap of the FFE away from the end of the FFE, where it is normally set, toward the middle of the FFE. The coefficients of the FFE are then adjusted, using the error signal derived from the CMA technique (which, as described above, requires neither a recovered data carrier nor accurate decisions), until the coefficients of the FFE converge. At this point, the DFE is enabled, and decisions are supplied to its input terminal. The FFE tap coefficients in the time delay range normally covered by the DFE are migrated to the DFE taps by leaking the coefficients of the FFE taps in a known manner. The center tap of the FFE is then moved back toward the end of the FFE. This method is very complicated to control, and requires more complicated circuitry for the FFE and extra circuitry to migrate the taps from the FFE to the DFE.

Another problem with this method is that the FFE is not as effective at compensating for ISI as the DFE would be. Thus, it is possible that the FFE, operating alone, will not be able to compensate the channel sufficiently for the quantizer to begin its operation sufficiently accurately. It is therefore possible that even though the FFE has compensated the channel as best it can, when the DFE is actuated, the equalizer as a whole will still not be sufficiently converged for the coefficients of the DFE to converge.

An adaptive equalizer arrangement is desirable which permits convergence of the DFE coefficients during the initial signal acquisition period, which does not require the prior acquisition of the data carrier (i.e. can operate using the CMA algorithm), and which neither requires complicated control and filter circuitry, nor imposes an additional computational burden.

Once the equalizer coefficients have been converged, there are two basic types of techniques for acquiring and tracking the phase and frequency of the data subcarrier: decision directed and non-decision directed. In decision directed techniques, the output from the quantizer, which is the sequence of received symbols corresponding to an estimate of the transmitted symbol sequence, is used to control the process of acquiring and tracking the data carrier signal. Non-decision directed techniques do not use the quantizer output signal. It is known that decision directed techniques have a problem when a receiver begins operation, or, as in the case of a television receiver, begins to process a newly selected signal. Channel impairments remaining after the blind equalization process, and initial inaccuracy in the data carrier timing recovery, cause the initial quantizer decisions to be wrong a substantial proportion of the time. The incorrect decisions, then, will prevent the data carrier from being properly acquired.

In order to facilitate the acquisition of the data carrier, it is known to produce decisions based on an artificially coarse constellation consisting of four constellation points: one in each quadrant. This solution is based on the assumption that while a decision based on a full constellation is likely to be wrong a substantial proportion of the time during the data carrier acquisition period, the sign of the I and Q components are likely to be correct. Thus, a decision based only on the sign of the I and Q components will less likely be erroneous, and will enable acquisition of the data carrier. The quantizer is operated in this quadrant mode until the accuracy of the decisions exeeds a predetermined threshold level. At that point, the quantizer is switched into the full decision mode.

However, it is possible that, despite the accuracy of the quantizer decisions in the quadrant mode, the data carrier timing will not be sufficiently accurate to complete the acquisition of the data carrier when the quantizer switches into the full decision directed mode. In such a case, it can take a relatively long period to complete the acquisition of the data carrier after switching to the full decision directed mode. It is even possible that the data carrier will never be acquired, allowing entry into the full decision mode, because the best accuracy achieved by the quantizer in the quadrant mode is not sufficient to retain the lock when switching to the full decision directed mode.

A data carrier acquisition and tracking technique is desirable which can always successfully acquire the phase and frequency of the data carrier from initial tuning of an equalized digital television signal until the quantizer begins operation in the full decision directed mode.

Yet another aspect of digital television receiver design concerns coexistence with the existing analog television system. Future digital television systems will coexist with existing analog television systems, possibly in the same spectral space. The analog signal produced by existing analog systems will appear to the digital television signal as a narrowband and continuous wave interference (CWI) signal. To prevent degradation in the performance of the digital television signal, such CWI signals must be suppressed.

Known methods for suppressing CWI interference involve an adaptive notch filter, followed by a DFE. The notch of the filter is adjusted to the spectral location of the CWI, and the DFE compensates for the notch inserted by the adaptive notch filter. But, adaptive notch filters are complicated to implement. A CWI suppression system is desirable which can suppress CWI without requiring a complicated adaptive notch filter.

SUMMARY OF THE INVENTION

In accordance with principles of the present invention, a television digital receiver includes a source of a television signal. An analog-to-digital converter is coupled to the television signal source, and is further responsive to a sample clock signal. A filter/complement is coupled to the analog-to-digital converter and has a first output terminal which produces a low-pass filtered television signal, and a second output terminal which produces a high-pass filtered television signal complementary to the low-pass filtered television signal. A sample clock generating circuit is coupled to the second output terminal of the filter/complement and produces the sample clock signal in response to the high-pass filtered television signal.

SUMMARY OF THE INVENTION

In accordance with another aspect of the present invention, a digital television receiver includes a source of a digital television signal. A series connection of a feedforward equalizer, a signal combiner, and a quantizer producing decisions of estimated received symbols corresponding to transmitted symbols, are coupled between the digital television signal source and utilization circuitry. In addition, a decision feedback equalizer has an input terminal, and an output terminal coupled to the signal combiner. A multiplexer has a first input terminal coupled to an output terminal of the signal combiner, a second input terminal coupled to an output terminal of the quantizer, and an output terminal coupled to an input terminal of the decision feedback equalizer. During an initial signal acquisition period, the multiplexer is conditioned to couple the output terminal of the signal combiner to the input terminal of the decision feedback equalizer, and during a normal signal processing period the multiplexer is conditioned to couple the output terminal of the quantizer to the input terminal of the decision feedback equalizer.

In accordance with yet another aspect of the present invention, a digital television receiver includes a quantizer which has a full decision quantizer portion, a quadrant decision quantizer portion, and an octant decision quantizer portion, which produces a decision having one of eight values located at predetermined locations in respective octants of the complex plane.

In accordance with yet another aspect of the invention, a digital television receiver receives a digital television signal including a narrow band continuous wave interference (CWI) signal having a spectral location. The receiver includes a CWI signal suppressor which has a fixed notch filter, having a notch at a fixed predetermined spectral location, a CWI signal detector, and a modulator, coupled to the fixed notch filter, for modulating the digital television signal to align the CWI spectral location with the fixed spectral location of the notch of the notch filter.

DETAILED DESCRIPTION

Figure 1:
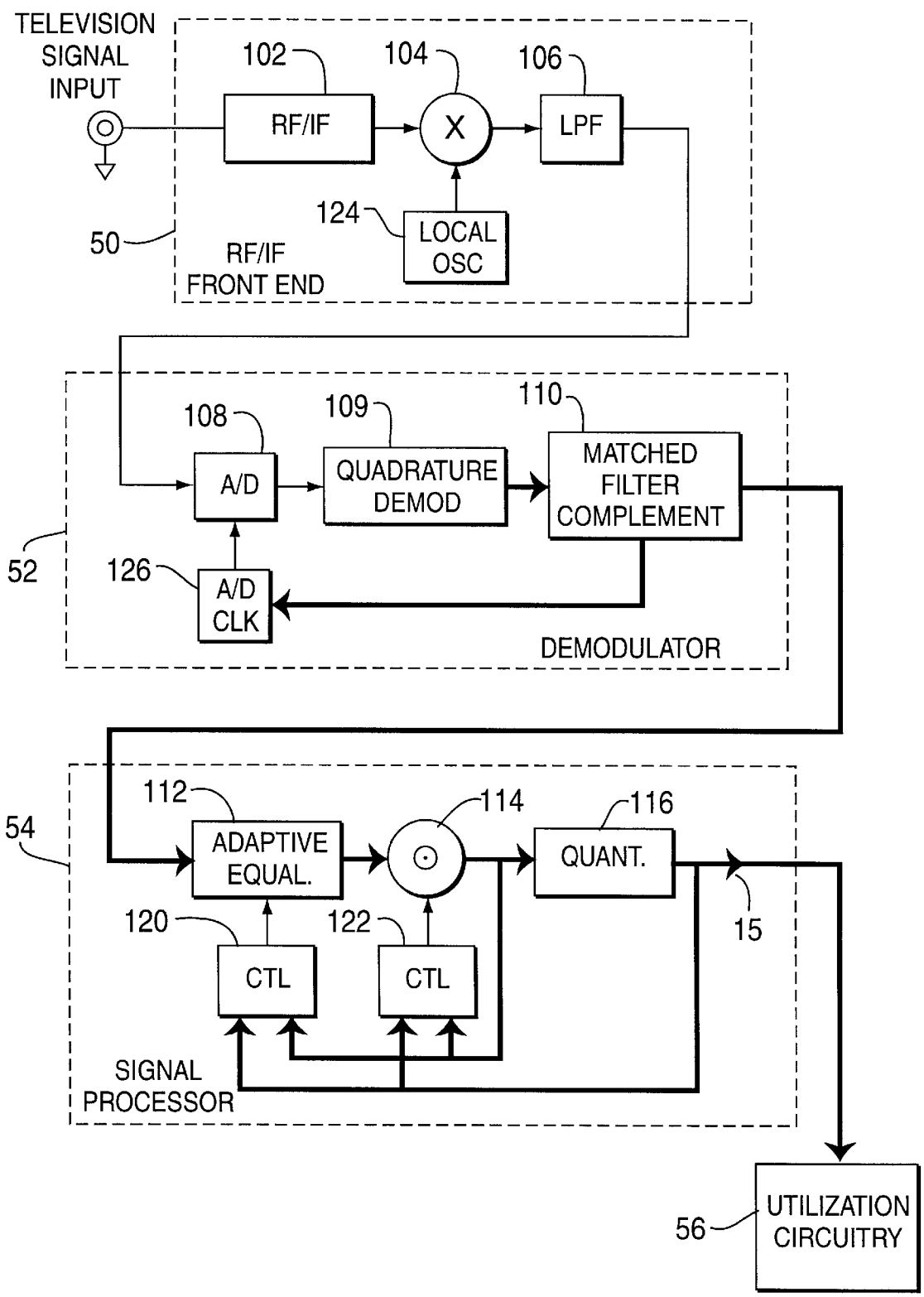
FIG. 1 is a block diagram of a portion of a digital television signal receiver according to principles of the present invention.

The present invention will be described in terms of a digital television receiver. However, the present invention is applicable to any receiver in a digital transmission system transmitting QAM or VSB modulated data. In general in the drawing, thin lines represent either data signal paths carrying simple signals such as real signals, or control signals. Thick lines represent data signal paths carrying complex signals. The data signals may be analog or multibit digital signals. There are circuit elements in a digital television signal receiver in addition to those illustrated in the drawing, but these additional elements are not necessary to understand the present invention, and have been omitted from the drawing for simplicity. One skilled in the art of digital television signal receiver design will understand what additional elements are necessary, and how to design, implement, and interconnect these additional elements with those illustrated in the drawing.

The portion of the receiver depicted in FIG. 1 contains an RF/IF front-end 50, a demodulator 52, a signal processor 54, and utilization circuitry 56. Important features of the invention are found in the A/D clock circuit 126 of the demodulator 52 and the equalization technique used in the signal processor 54. Specifically, the clock circuit 126 produces an accurate timing signal from either VSB or QAM signals, while the equalization technique is performed upon a passband signal and features both forward equalization and selective feedback equalization that operates on both VSB and QAM signals. The RF/IF front end contains a block diagram of a portion of a digital television signal receiver implemented according to principles of the present invention. In FIG. 1, a radio frequency/intermediate frequency (RF/IF) signal receiver 102 is coupled to a source (not shown) of a television signal (e.g., a QAM or VSB signal) modulated on an RF carrier, as described above. The RF modulated television signal source may, for example, be an antenna or a cable system. An output terminal of the RF/IF receiver 102 is coupled to a first input terminal of a mixer 104. A local oscillator 124 is coupled to a second input terminal of the mixer 104. An output terminal of the mixer 104 produces a television signal encoded as described above and is coupled to an input terminal of a low pass filter (LPF) 106. An output terminal of the LPF 106 is coupled to a signal input terminal of an analog-to-digital converter (A/D) 108 within the demodulator 52. An output terminal of the A/D converter 108 is coupled to an input terminal of a quadrature demodulator and phase splitter 109. An output terminal of the quadrature demodulator 109 produces a sequence of multibit digital signals representing the complex, passband digital television signal, and is coupled to an input terminal of a matched filter/complement 110.

A first output terminal of the matched filter/complement 110 is coupled to an A/D converter sample clock circuit 126. This clock circuit produces accurate timing signals from either QAM or VSB signals. An output terminal of the A/D converter sample clock circuit 126 is coupled a sample clock input terminal of the A/D converter 108. A second output terminal of the matched filter/complement 110 is coupled to a signal input terminal of an adaptive equalizer 112. An output terminal of the adaptive equalizer 112 is coupled to a signal input terminal of a derotator 114. An output terminal of the derotator 114 is coupled to a quantizer 116 and to respective first input terminals of an adaptive equalizer control circuit 120 and a derotator control circuit 122. An output terminal of the quantizer 116 is coupled to an output terminal 15 and to respective second input terminals of the adaptive equalizer control circuit 120 and the derotator control circuit 122. The output terminal 15 is coupled to utilization circuitry 56. The utilization circuitry may, for example, be circuitry coupled to a display device for displaying the image represented by the video signal, or a storage system, such as a video cassette recorder.

In operation, the combination of the RF/IF receiver 102, the mixer 104, the local oscillator 124, and the LPF 106 cooperate in a known manner to down convert the RF modulated encoded digital television signal to produce an analog television signal having a near baseband IF frequency. The A/D converter 108 converts the analog passband television signal into a sequence of multibit digital samples representing the television signal in a known manner. The frequency and phase of the sampling signal supplied to the A/D converter 108 is adjusted by the A/D converter clock circuit 126 so that it is synchronized to the sample clock in the transmitter, in a manner described below. The digital television signal from the A/D converter 108 is demodulated in the quadrature demodulator 109 in a known manner. This demodulation process produces respective signals representing the real (in-phase) and imaginary (quadrature) components of a complex digital passband television signal. This complex digital television signal is then filtered in the matched filter/complement 110 which has a characteristic matched to the transmit pulse shape. The signal from the matched filter/complement 110 is equalized by the adaptive equalizer 112 to compensate for varying channel characteristics, and to minimize intersymbol interference. The derotator 114 operates to acquire and track the frequency and phase of the passband QAM carrier signal, a process known as data carrier recovery, and translate it to the baseband.

The quantizer 116 evaluates the complex baseband signal at its input terminal and produces as its output signal a complex signal having the value of the location on the complex plane corresponding to the constellation point which is closest to the value of the input signal. This signal is supplied to the utilization circuitry 56 for further processing. A comparison of the signals at the input and output terminals of the quantizer 116, can give an estimate of the error introduced by the channel. The adaptive equalizer control circuit 120 and the derotator control circuit 122 adapt the processing of the adaptive equalizer 112 and the derotator 114, respectively, in response to these two signals.

Figure 2:
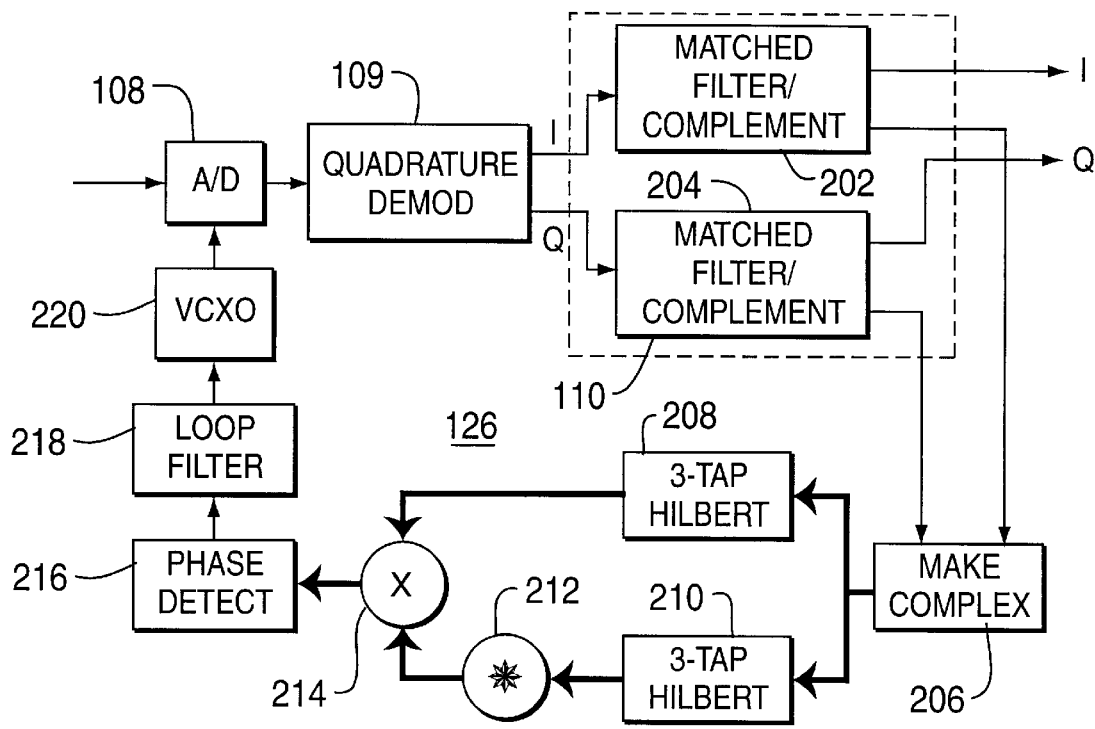
FIG. 2 is a more detailed block diagram of the portion of the digital television signal receiver illustrated in FIG. 1 for synchronizing the receiver sampling clock to the transmitting clock.

FIG. 2 is a more detailed block diagram of a portion of the digital television signal receiver illustrated in FIG. 1 for synchronizing the receiver sampling clock to the transmitting clock for either QAM or VSB modulated data. In FIG. 2, the analog television signal from the LPF 106 (of FIG. 1) is converted to a sequence of successive multibit digital signals by the A/D converter 108. The quadrature demodulator 109 demodulates the digital television signal represented by the digital signal sequence into in-phase I (real) and quadrature Q (imaginary) component signals, illustrated separately in FIG. 2, in a known manner.

The I component signal is coupled to an input terminal of a first root raised cosine filter and complement 202, and the Q component signal is coupled to an input terminal of a second root raised cosine filter and complement 204. The first and second matched filter/complements, 202 and 204, respectively, in combination, form the matched filter/complement 110 illustrated in FIG. 1. A first output terminal of the first matched filter/complement 202 is coupled to an I output terminal of the matched filter 110, and a second output terminal of the first matched filter complement 202 is coupled to a first Input terminal of a known complex signal generating circuit 206. A first output terminal of the second matched filter complement 204 is coupled to a Q output terminal of the matched filter 110, and a second output terminal of the second matched filter complement 204 is coupled to a second input terminal of the complex signal generating circuit 206. An output terminal of the complex signal generating circuit 206 is coupled to respective input terminals of first and second 3-tap Hilbert filters, 208 and 210, which extract the positive and negative band edge component signals, respectively. An output terminal of the first Hilbert filter 208 is coupled to a first input terminal of a complex multiplier 214. An output terminal of the second Hilbert filter 210 is coupled to a second input terminal of the complex multiplier 214 through a complex conjugating circuit 212, which calculates the complex conjugate of the signal at its input terminal. An output terminal of the complex multiplier 214 is coupled to an input terminal of a phase detector 216. An output terminal of the phase detector 216 is coupled to the sample clock input terminal of the A/D converter 108 through the series connection of a loop filter 218, and voltage controller crystal oscillator (VCXO) 220.

In operation, the first and second matched filter/ complements, 202 and 204, respectively, produce at their respective first output terminals a low pass filtered output signal matched to the transmit pulse shape. These output signals are supplied to the adaptive equalizer 112 (of FIG. 1). The first and second matched filter/complements, 202 and 204, respectively, also produce at their respective second output terminals a complementary high pass filtered output signal which is used for band edge timing recovery and is supplied to the complex signal generating circuit 206. The combination of the complex signal generating circuit 206, the first and second Hilbert filters 208 and 210, the complex conjugate circuit 212 and the complex multiplier 214 generates a signal representing the timing error of the sampling signal supplied to the A/D converter 108, in a manner known for QAM and VSB signals.

The illustrated embodiment using a single circuit is arranged for processing either QAM or VSB modulated digital television signals. The high pass filtered signal from the matched filter complements, 202 and 204, respectively, contains positive and negative high frequency components marking the band edges of the digital television signal. To generate the timing signal, the first and second Hilbert filters, 208 and 210, respectively extract the positive and negative high frequency components. The complex product of one high frequency component with the complex conjugate of the other high frequency component is produced by the combination of the complex multiplier 214 and the conjugate circuit 212. The phase detector 216 detects one complex component, for example the imaginary component, of this signal, and the combination of the phase detector 216, the loop filter 218 and the VCXO 220 operate to drive this complex component to zero, and thus eliminate the timing offset.

The illustrated embodiment will produce correct timing for signals containing VSB modulated data. However, for signals containing QAM modulated data, the illustrated embodiment produces a sampling clock at twice the QAM symbol rate. This means that a symbol occurs every other clock pulse. Specifically, one clock pulse occurs at a symbol time; a next clock pulse occurs at the crossover time between symbols; a next clock pulse occurs at the succeeding symbol time and so forth. This results in a phase ambiguity in the sampling clock signal when receiving QAM data signals. However, one skilled in the art of communications receiver design will understand how to use information derived from the equalizer and quantizer to resolve this ambiguity and determine which clock pulses occur at symbol times, and which occur at crossover times.

In prior art arrangements, two separate filters were required: one matched filter for the adaptive equalizer, and a separate filter to provide the high frequency band edge components for the timing recovery circuitry. In the present application, a single filter provides both the low frequency matched filtered signal, and the complementary high pass filtered signal. This simplifies the circuitry of the sample timing circuitry, and decreases the cost of implementing this circuitry. In addition, this matched filter/complement is a simple filter, with one filter section processing the real component and a second filter section processing the imaginary component. The matched filter/complement is discussed in detail below with reference to FIG. 4.

In addition, prior art arrangements required two complex filters to derive the positive and negative high frequency band edge components, the implementation of each of which required two filters, one for the real component and one for the imaginary component. Thus, prior art arrangements required four filters instead of two, according to the present invention. In addition, in the present application, two relatively simple Hilbert filters, which do not require any multipliers, derive the positive and negative high frequency components.

Figure 3:
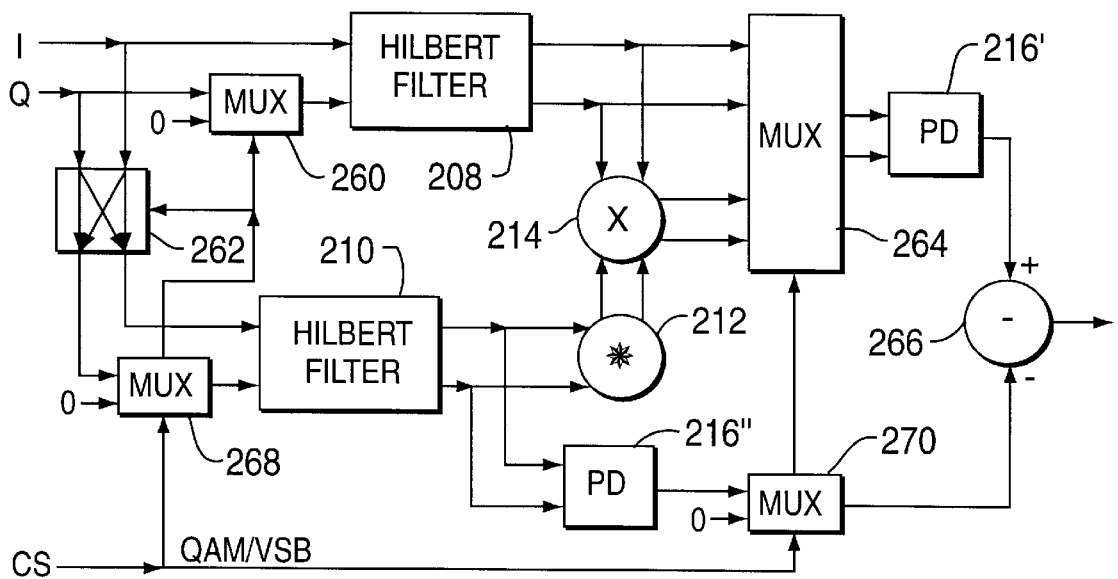
FIG. 3 is a more detailed block diagram of an alternative embodiment of the portion of the television receiver illustrated in FIG. 1 for synchronizing the receiver sampling clock to the transmitting clock.

FIG. 3 is a more detailed block diagram of an alternative embodiment of the portion of the television receiver illustrated in FIG. 2 for synchronizing the receiver sampling clock to the transmitting clock. The alternative embodiment illustrated in FIG. 3 can also synchronize the sampling clock for signals containing either QAM modulated data, or VSB modulated data. However, this embodiment has been modified so that the phase ambiguity for signals containing QAM modulated data, described above, has been eliminated. Elements in FIG. 3 which are similar to those illustrated in FIG. 2 are designated by the same reference number, and are not described in detail below.

In FIG. 3, a pair of input terminals I and Q receive real and imaginary component signals of a complex signal from respective matched filter/complements 202 and 204 (of FIG. 2). The real component signal input terminal I is coupled to a real input terminal of the first Hilbert filter 208, and to a real input terminal of a known controllable I/Q swapper circuit 262. The imaginary component signal Q is coupled to a first data input terminal of a first multiplexer 260, and to an imaginary input terminal of the controllable I/Q swapper circuit 262. A zero valued signal is coupled to the second data input terminal of the first multiplexer, and an output terminal of the first multiplexer 260 is coupled to an imaginary input terminal of the first Hilbert filter 208.

Respective real and imaginary output terminals of the first Hilbert filter 208 are coupled to a corresponding pair of data input terminals of a complex multiplexer 264 and a complex multiplier 214. A pair of real and imaginary output terminals of the complex multiplier 214 is coupled to a second pair of data input terminals of the complex multiplexer 264. A pair of output terminals of the complex multiplexer 264 is coupled to a corresponding pair of input terminals of a first phase detector (PD) 216', and an output terminal of the PD 216' is coupled to a non-inverting input terminal of a subtractor 266. An output terminal of the subtractor 266 is coupled to the input terminal of the loop filter 218 (of FIG. 2).

A real output terminal of the controllable I/Q swapper circuit 262 is coupled to a real input terminal of the second Hilbert filter 210. An imaginary output terminal of the controllable I/Q swapper circuit 262 is coupled to a first data input terminal of a second multiplexer 268. A zero valued signal is coupled to a second data input terminal of the second multiplexer 268, and an output terminal of the second multiplexer 268 is coupled to an imaginary input terminal of the second Hilbert filter 210. Respective real and imaginary output terminals of the second Hilbert filter 210 are coupled to respective input terminals of the complex conjugation circuit 212, and to a second phase detector PD 216". A pair of real and imaginary output terminals of the complex conjugation circuit 212 are coupled to a corresponding second pair of input terminals of the complex multiplier 214.

An output terminal of the second PD 216" is coupled to a first data input terminal of a third multiplexer 270, and a zero valued signal is coupled to a second data input terminal of the third multiplexer 270. An output terminal of the third multiplexer 270 is coupled to an inverting input terminal of the subtractor 266. A control signal input terminal CS is coupled to respective control input terminals of the first, second and third multiplexers, 260, 268 and 270, to a control input terminal of the complex multiplexer 264, and to a control input terminal of the controllable I/Q swapper circuit 262.

In operation, the control signal from the control signal input terminal CS has a first state when the timing recovery circuit in FIG. 3 is to be set to receive a VSB television signal, and has a second state when it is to be set to receive a QAM modulated signal.

When a VSB signal is being received, the control signal conditions the multiplexers and the controllable I/Q swapper circuit 262 to arrange the circuit illustrated in FIG. 3 to the arrangement illustrated in FIG. 2. Specifically, the controllable I/Q swapper circuit is conditioned to pass the signals at its input terminals to its output terminals unchanged. The first multiplexer 260 is conditioned to pass the signal from the Q input terminal to the first Hilbert filter 208, and the second multiplexer 268 is conditioned to pass the signal from the controllable I/Q swapper circuit 262 to the second Hilbert filter 210. The complex multiplexer 264 is conditioned to couple the signal from the complex multiplier 214 to the first phase detector 216' and the third multiplexer 270 is conditioned to pass the zero-valued signal to the subtracter 266. The resulting arrangement is the same as that illustrated in FIG. 2.

However, when a QAM signal is to be received, the control signal CS is placed in the second state. In this case, the controllable I/Q swapper circuit 262 is conditioned to produce an output signal in which the real and imaginary components of the input signal are swapped. That is, the signal at the real output terminal of the controllable I/Q swapper 262 is the signal from its imaginary input terminal, and the signal at the imaginary output terminal is the signal from its real input terminal. The first and second multiplexers, 260 and 268, respectively, are conditioned to pass the zero valued signal to the imaginary input terminals of their corresponding Hilbert filters, 208 and 210, respectively. The complex multiplexer 264 is conditioned to couple the output of the first Hilbert filter 208 to the first phase detector 216', and the third multiplexer 270 is conditioned to couple the output of the second phase detector 216" to the subtractor 266. In this configuration, the combination of the first and second phase detectors, 216' and 216", and the subtractor 266, operate as the phase detector 216 illustrated in FIG. 2.

In either arrangement, the Hilbert filters 208 and 210 extract the positive and negative high frequency band edge components of the television signal, and the phase detectors 216' and 216" produce a correction signal to control the timing of the A/D converter 108 (of FIG. 2), as described above.

Figure 4:
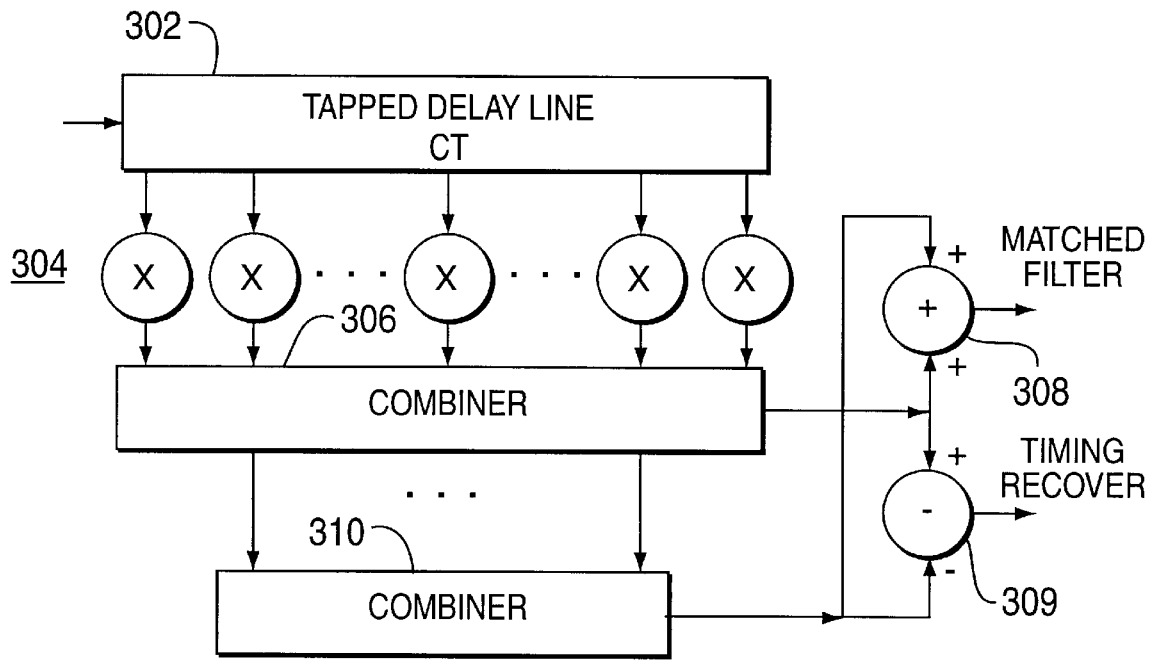
FIG. 4 is a more detailed block diagram of a filter arrangement for use in the portion of the digital television signal receiver illustrated in FIG. 1 and FIG. 2.

FIG. 4 is a more detailed block diagram of a matched filter/complement for use in the portion of the digital television signal receiver illustrated in FIG. 1 and in FIG. 2 or FIG. 3. FIG. 4 illustrates the arrangement of the matched filter/complement 202 and/or 204. In FIG. 4, an input terminal of a tapped delay line 302 is coupled to the output terminal of the quadrature demodulator 109 (of FIG. 2). The tapped delay line 302 includes a plurality of output terminals, including even and odd taps and a center tap (CT), each producing copies of the signal at the input terminal delayed by respectively different time periods, in a known manner. Respective input terminals of a plurality of coefficient multipliers 304 are coupled to corresponding output terminals of the tapped delay line 302. Respective output terminals of the coefficient multipliers 304 coupled to the odd taps of the tapped delay line 302, including the center tap CT, are coupled to corresponding input terminals of a first signal combiner 306. Respective output terminals of the coefficient multipliers coupled to the even taps of the tapped delay line 302 are coupled to corresponding input terminals of a second signal combiner 310. An output terminal of the first signal combiner 306 is coupled to a first input terminal of an adder 308 and a non-inverting input terminal of a subtractor 309. An output terminal of the second signal combiner 310 is coupled to a second input terminal of the adder 308 and an inverting input terminal of the subtractor 309. An output terminal of the adder 308 provides the low pass filtered matched filter output signal and is coupled to the adaptive equalizer 112 (of FIG. 1). An output terminal of the subtractor 309 provides the complementary high pass filtered band edge signal, and is supplied to the make complex circuit 206 (of FIG. 2).

In operation, the filter arrangement of FIG. 4 provides complementary low pass and high pass filtered versions of the input television signal. The low pass filtered version has a frequency characteristic matched to the transmitted pulse. The complementary high pass filtered version may be used to provide the band edge timing recovery. In this manner a single filter, plus a single additional subtractor, may be used to provide both functions. This lowers the fabrication cost of a television receiver constructed in this manner.

Figure 5:
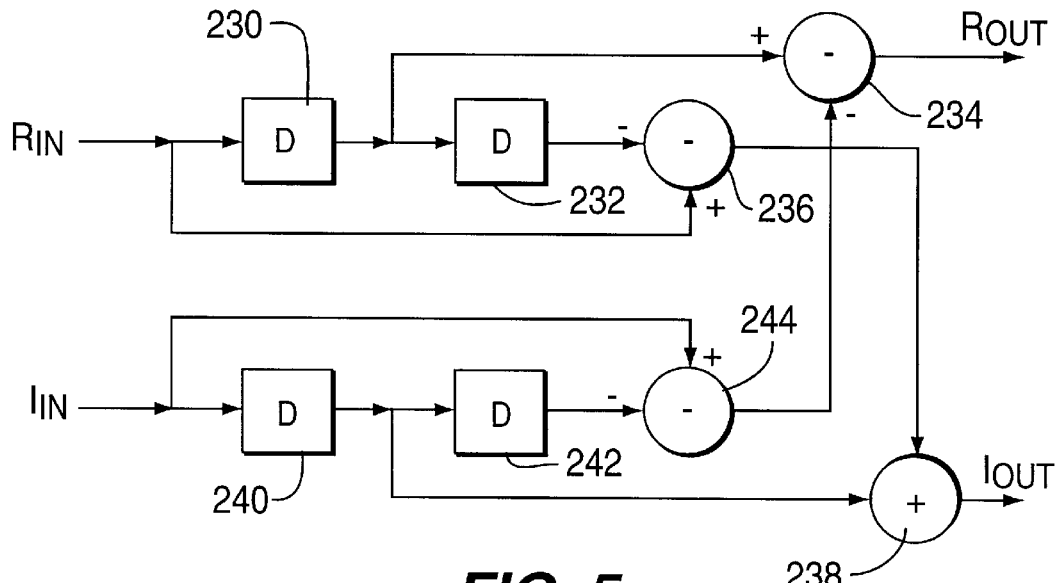
FIG. 5 is a more detailed block diagram illustrating the Hilbert filter used in the portion of the receiver illustrated in FIG. 3.

FIG. 5 is a more detailed block diagram illustrating the Hilbert filters 208 and 210 used in the portion of the receiver illustrated in FIG. 2 and FIG. 3. In FIG. 5, a real input terminal $R_{in}$ and an imaginary input terminal in are coupled to corresponding output terminals of the first and second matched filter complements 202 and 204, respectively (of FIG. 2). The $R_{in}$ input terminal is coupled to an input terminal of a first delay circuit 230 and to a non-inverting input terminal of a first subtractor 236. An output terminal of the first delay circuit 230 is coupled to an input terminal of a second delay circuit 232 and to a non-inverting input terminal of a second subtractor 234. An output terminal of the second delay circuit 232 is coupled to an inverting input terminal of the first subtracter 236.

The $I_{in}$ input terminal is coupled to an input terminal of a third delay circuit 240 and to a non-inverting input terminal of a third subtracter 244. An output terminal of the third delay circuit 240 is coupled to an input terminal of a fourth delay circuit 242 and to a first input terminal of an adder 238. An output terminal of the fourth delay circuit 242 is coupled to an inverting input terminal of the third subtractor 244. An output terminal of the first subtractor 236 is coupled to a second input terminal of the adder 238, and an output terminal of the third subtractor 244 is coupled to an inverting input terminal of the second subtracter 234. An output terminal of the second subtractor 234 produces the real output signal $R_{out}$, and an output terminal of the adder 238 produces the imaginary output signal $I_{out}$. The respective real and imaginary output terminals, $R_{out}$ and $I_{out}$ are coupled to corresponding input terminals of the make complex circuit 206 of FIG. 2.

The Hilbert filter illustrated in FIG. 5 operates in a known manner to extract a positive high frequency component of the band edge signal from the matched filter/complement filters 110, as described above. This Hilbert filter, however, does not require multipliers; but instead requires only delay circuits, adders and subtractors, all of which are relatively inexpensive, compared to multiplier circuits. A Hilbert filter 210, for extracting a negative high frequency component, is constructed in a similar manner as that illustrated in FIG. 5 by reversing the signs on the input terminals of the subtracters 236 and 244.

Figure 6:
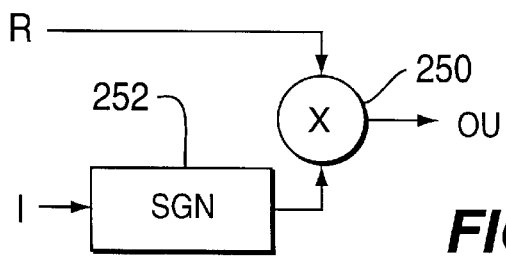
FIG. 6 is a more detailed block diagram of a phase detector used in the portion of the receiver illustrated in FIG. 4.

FIG. 6 is a more detailed block diagram of a phase detector used in the portion of the receiver illustrated in FIG. 3. In FIG. 6 a real signal input terminal R is coupled to a first input terminal of a multiplier 250. An imaginary signal input terminal I is coupled to an input terminal of a known SGN circuit. An output terminal of the SGN circuit is coupled to a second input terminal of the multiplier 250. An output terminal of the multiplier 250 produces the output signal OUT of the phase detector. The phase detector illustrated in FIG. 6 operates in a known manner to produce a signal representing the phase of the complex, signal at its input terminals.

Figure 7:
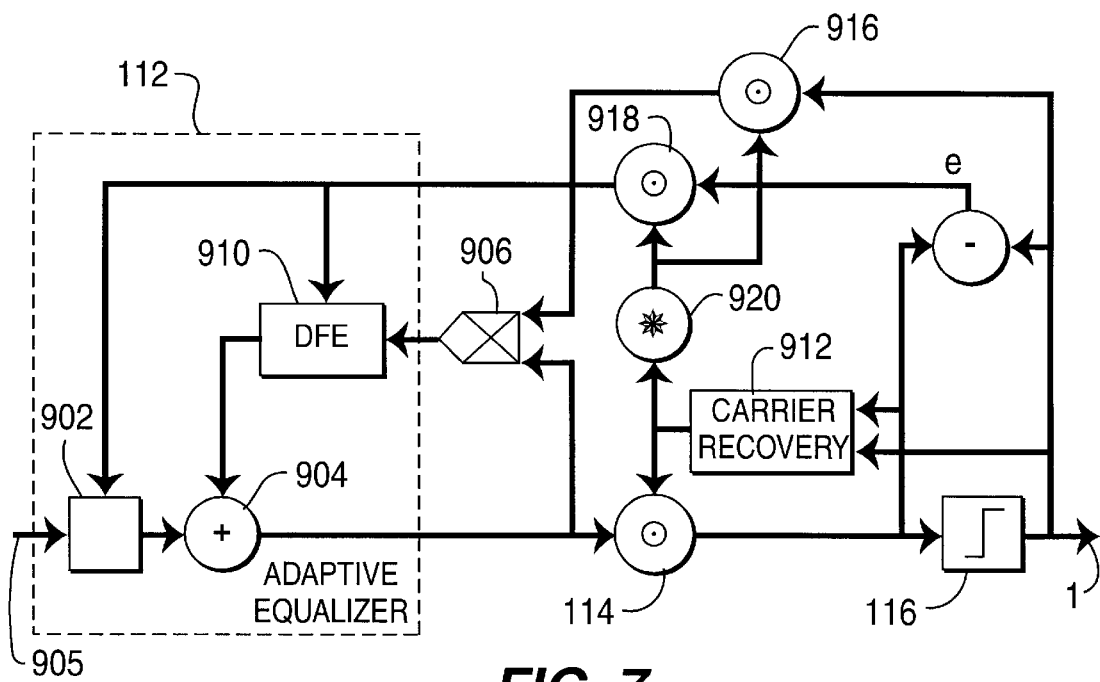
FIG. 7 is a more detailed block diagram illustrating a portion of the television signal receiver illustrated in FIG. 1 for setting the coefficients in the adaptive equalizer upon initial sign acquisition.

After the A/D converter 108 (of FIG. 1) has been properly time synchronized to the input symbol stream, in the manner described above, the coefficients of the adaptive equalizer 112 must be adapted to the newly received signal. FIG. 7 is a more detailed block diagram illustrating a portion of the television signal receiver illustrated in FIG. 1 for setting the coefficients in the adaptive equalizer 112 upon initial signal acquisition, and adjusting the coefficients in response to changes in the channel during reception of the signal. In FIG. 7, an input terminal 905 is coupled to the output terminal of the matched filter/complement 110 (of FIG. 1). Input terminal 905 is coupled to an input terminal of a feedforward equalizer FFE 902. An output terminal of the FFE 902 is coupled to a first input terminal of a signal combiner 904. An output terminal of the signal combiner 904 is coupled to a first data input terminal of a multiplexer 906 and the derotator 114. An output terminal of the multiplexer 906 is coupled to a data input terminal of a decision feedback equalizer DFE 910. An output terminal of the DFE 910 is coupled to a second input terminal of the signal combiner 904. The combination of the FFE 902, signal combiner 904 and DFE 910 form the adaptive equalizer 112 (of FIG. 1).

An output terminal of the derotator 114 is coupled to an input terminal of the quantizer 116, to a first input of a carrier recovery circuit 912, and to a first input terminal of a subtractor 914. An output terminal of the quantizer 116 is coupled to a second input terminal of the carrier recovery circuit 912, to a second input terminal of the subtractor 914, and to a data input terminal of a first rerotator 916. An output terminal of the first rerotator 916 is coupled to a second data input terminal of the multiplexer 906. An output terminal of the subtracter 914 produces an error signal e and is coupled to a data input terminal of a second rerotator 918. An output terminal of the second rerotator 918 is coupled to respective control input terminals of DFE 910 and FFE 902.

An output terminal of the carrier recovery circuit 912 is coupled to a control input terminal of the derotator 114, and to an input terminal of a complex conjugate circuit 920. An output terminal of the complex conjugate circuit 920 is coupled to respective control input terminals of the first and second rerotators 916 and 918.

In operation, the adaptive equalizer 112, including the FFE 902, the DFE 910 and the signal combiner 904, operate on a television signal in the passband, before the QAM carrier has been recovered. The remainder of the circuit, including the quantizer 116, the subtractor 914, and the carrier recovery circuit 912, operate on the television signal at baseband. The derotator 114 performs the translation from the passband to the baseband under the control of the carrier recovery circuit 912.

The adaptive equalizer 112 uses the known constant modulus algorithm (CMA) technique for adapting its coefficients to a newly received television signal. This algorithm does not use decisions from the quantizer 116. In order to simultaneously adapt the coefficients of both the FFE 902 and the DFE 910 during initial signal acquisition, the multiplexer 906 is conditioned to couple the output of the signal combiner 904 to the input terminal of the DFE 910 during the signal acquisition period. Thus, during the signal acquisition period, the FFE 902 and DFE 910 operate as a finite impulse response filter (FIR) and an infinite impulse response (IIR) filter, respectively.

As described above, in prior art arrangements, the DFE 910 is disabled, and the center tap of the FFE 902 is moved to provide some ISI cancellation during the signal acquisition period. After the coefficients in the FFE 902 have converged, the DFE 910 is activated and the coefficients in the FFE 902 are migrated to the DFE 910 by leaking them from the FFE 902. Then the center tap of the FFE 902 is restored to its normal position. In the present application, the FFE 902 and DFE 910 operate as an FIR and IIR pair, as described above, during the signal acquisition period. The coefficients of both the FFE 902 and the DFE 910 are adjusted, simultaneously, using the known CMA technique, until they converge.

This arrangement provides two advantages. First, the DFE 910, operated as an IIR, provides better ISI cancellation during the signal acquisition period than the FFE 902 alone provides. Thus, the decisions made by the quantizer 116 after the coefficients in the adaptive equalizer have converged (in a manner to be described in more detail below) are likely to be more accurate than those in the prior art arrangement, and subsequent data carrier recovery will, therefore, more likely proceed properly. Second, there is no migration of coefficients from the FFE 902 to the DFE 910 after the signal acquisition period, as in the prior art arrangement. This results in a simpler circuit structure with simpler controlling circuitry.

The equalized television signal from the adaptive equalizer 112 is a passband signal. During normal operations, this signal is translated into the baseband in a known manner by the operation of the derotator 114 under the control of the carrier recovery circuit 912 (described in more detail below). The baseband signal from the derotator 114 is then processed by the quantizer 116 to generate estimated received symbols, which correspond to the transmitted symbols.

Figure 8:
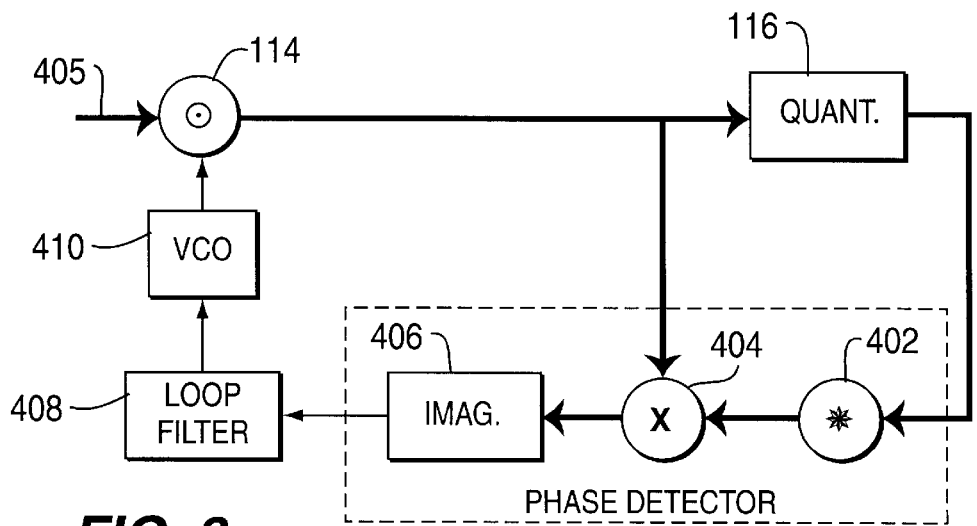
FIG. 8 and FIG. 11 are more detailed block diagrams of a portion of a digital television signal receiver illustrated in FIG. 1 implmenting data carrier timing recovery.
Figure 9:
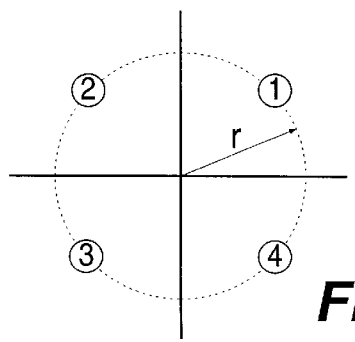
FIG. 9 and FIG. 10 are complex plane diagrams useful in understanding the operation of the portion of the digital television signal receiver illustrated in FIG. 7, FIG. 8 and FIG. 11.
Figure 10:
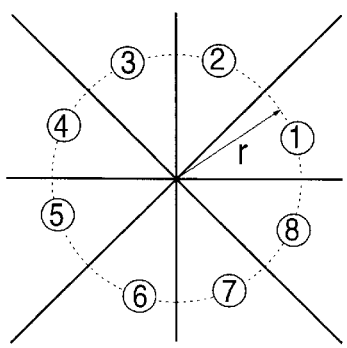
Figure 11:
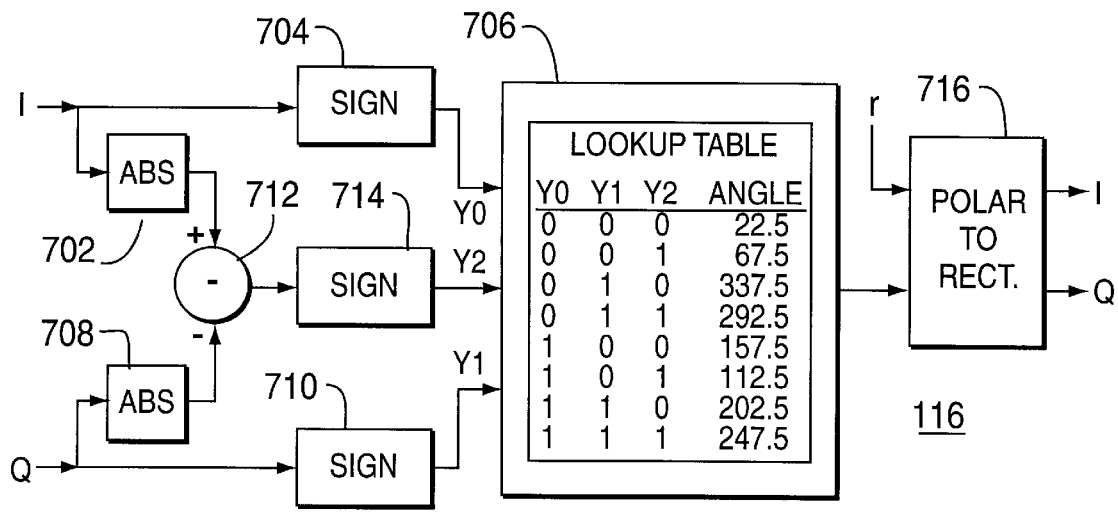

However, during the signal acquisition period, after the coefficients of the adaptive equalizer 112 have converged (as described above), the timing of the QAM carrier signal must be acquired, in a manner to be described in more detail below. During this carrier recovery period, the FFE 902 and DFE 910 remain in the FIR/IIR arrangement. FIG. 8 and FIG. 11 are more detailed block diagrams of the portion of the digital television signal receiver illustrated in FIG. 7 implementing carrier timing acquisition, and FIG. 9 and FIG. 10 are complex plane diagrams useful in understanding the operation of the portion of the digital television signal received illustrated in FIG. 7, FIG. 8, and FIG. 11.

FIG. 8 illustrates circuitry for tracking the phase of the QAM carrier based on the decisions made by the quantizer 116. In FIG. 8 an input terminal 405 is coupled to the output, terminal of the adaptive equalizer 112 (of FIG. 1). Input terminal 405 is coupled to the data input terminal of the derotator 114, and the output terminal of the derotator 114 is coupled to the input terminal of the quantizer 116, as is illustrated in FIG. 1. The output terminal of the derotator 114 is also coupled to a first input terminal of a complex multiplier 404. The output terminal of the quantizer 116 is coupled to an input terminal of a complex conjugating circuit 402. An output terminal of the complex conjugating circuit 402 is coupled to a second input terminal of the complex multiplier 404. An output terminal of the complex multiplier 404 is coupled to an input terminal of a circuit 406 which produces the imaginary component of the complex: output signal from the complex multiplier 404. An output terminal of the imaginary component circuit 406 is coupled to the control input terminal of the derotator 114 through the series connection of a loop filter 408 and voltage controlled oscillator (VCO) 410. The carrier recovery circuit illustrated in FIG. 8 is applicable to QAM modulated digital signals. With some slight modifications, known to one skilled in the art, it is also applicable to VSB and offset QAM modulated signals.

During normal operations, the derotated received signal from the derotator 114 is processed by the quantizer 116 to determine the constellation point on the complex plane to which this received signal is closest. The output of the quantizer 116 is a complex signal having the value of that closest constellation point. However, when the receiver initially receives a new signal, the QAM carrier frequency and phase have not yet been acquired. Thus, the decisions made by the quantizer 116 will often be wrong. Using wrong decision in an attempt to acquire the QAM carrier phase will impair such acquisition, and may even prevent acquisition.

In order to initially acquire the QAM carrier, the decisions made by the quantizer 116 are first made in a coarse fashion. For example, referring to the complex plane illustrated in FIG. 9, it is known when beginning operation to assume an artificial constellation consisting of four points: 1, 2, 3, and 4, each lying at a radius r from the origin and along a 45 degree, 135 degree, 225 degree and 315 degree angle, respectively. A quantizer operating according to this constellation will produce a signal corresponding to point 1 whenever the input complex signal at the input terminal is in the first quadrant. It will produce a signal corresponding to point 2 whenever the input complex signal is in the second quadrant, and so forth. In prior art arrangements, such a quantizer operates using this constellation until the decisions being made are sufficiently accurate. For example, if 90% of the decision were accurate, then the quantizer was switched from the quadrant mode to a full decision directed mode, in which decisions are made involving the full constellation.

However, in some cases, the partial QAM carrier acquisition achieved by operating the quantizer 116 in the quadrant mode is not sufficient to allow the quantizer 116 to achieve lock when switched to the full decision directed mode. According to the present invention, after the quantizer 116, operating in the quadrant mode, has achieved the desired degree of accuracy, the quantizer 116 begins operations in a finer mode, but not yet in the full decision directed mode. Referring to FIG. 10, the complex plane is divided into octants, and an artificial constellation is used in the quantizer 116 consisting of eight points: 1, 2, 3, 4, 5, 6, 7 and 8, each lying at a radius r from the origin and along a 22.5 degree, 67.5 degree, 112.5 degree, 157.5 degree, 202.5 degree, 247.5 degree, 292.5 degree, and 337.5 degree angle, respectively. When the quantizer 116 operates in this mode, any input signal lying the octant containing point 1 will condition the quantizer 116 to produce a signal having the value of point 1; any input signal lying in the octant containing point 2 will condition the quantizer 116 to produce a signal having the value of point 2, and so forth. When the quantizer 116 operating in the octant mode of FIG. 10 has achieved the desired accuracy, the resulting error is much less than would have been produced by a quantizer operating in the quadrant mode. It is much more likely that QAM carrier recover will be achieved when the quantizer 116 is switched into the full decision directed mode from the octant mode, than from the quadrant mode.

FIG. 11 is a more detailed block diagram of a portion of the quantizer 116 which performs quantization in the octant mode, as described above. In FIG. 11, separate I and Q input terminals are illustrated which are coupled to receive the I and Q components of the complex signal from the output terminal of the derotator 114 (of FIG. 8). The I input terminal is coupled to respective input terminals of a first absolute value circuit 702 and a first sign determining circuit 704. An output terminal of the first sign determining circuit 704 is coupled to a Y0 input terminal of an angle calculating circuit 706. The Q input terminal is coupled to respective input terminals of a second absolute value circuit 708 and a second sign determining circuit 710. An output terminal of the second sign determining circuit 710 is coupled to a Y1 input terminal of the angle calculating circuit 706. An output terminal of the first absolute value circuit 702 is coupled to a non-inverting input terminal of a subtractor 712, and an output terminal of the second absolute value circuit 708 is coupled to an inverting input terminal of the subtracter 712. An output terminal of the subtracter 712 is coupled to an input terminal of a third sign determining circuit 714. An output terminal of the third sign determining circuit 714 is coupled to a Y2 input terminal of the angle calculating circuit 706. An output terminal of the angle calculating circuit 706 is coupled to a first input terminal of a polar-to-rectangular converter 716. A second input terminal of the polar-to-rectangular converter 716 is coupled to a source of a signal having the value r. Respective I and Q output terminals of the polar-to-rectangular converter 716 are coupled to the output terminal 15, to the derotator control circuit 122, and to the adaptive equalizer control circuit 120 (of FIG. 1).

In operation, each sign determining circuit (704, 710 and 714) produce a logic '0' signal if the value of its input signal is positive and a logic '1' if it is negative. Referring again to FIG. 10, if the value of the output signal from the first sign determining circuit 704 is a logic '0', then the value of the input complex signal is in the right half of the illustrated complex plane, and if it is a logic '1', then it is in the left half. Similarly, if the value of the output signal from the second sign determining circuit 710 is a logic '0', then the value of the input complex signal is in the upper half of the illustrated complex plane, and if it is a logic '1', then it is in the lower half. If the value of the output signal from the third sign determining circuit 714 is a logic '0', then the value of the input complex signal is in an octant adjacent the horizontal I axis, i.e. octant 1, 4, 5, or 8, and if it is a logic '1', then it is in an octant adjacent the vertical Q axis, i.e. octant 2, 3, 6, or 7. The angle calculating circuit 706 processes the signals at the Y0, Y1 and Y2 input terminals, determines in which octant the input complex signal lies, and generates an angle which bisects that octant. For example, if Y0 is a logic '0', indicating that the complex signal lies in the right half of the complex plane; Y2 is a logic '0' indicating that the complex signal lies in the upper half of the complex plane; and Y1 is a logic '0' indicating that the complex signal lies in an octant adjacent the horizontal I axis: this is octant 1. The angle of the bisector of octant 1 is 22.5 degrees. The angle calculating circuit may comprise an eight entry lookup table arranged as illustrated in FIG. 10.

The polar-to-rectangular converter 716 takes the angle generated by the angle calculating circuit 706, and the radius input signal r and generates the rectangular complex coordinates (i.e. the in-phase (real) I, and quadrature (imaginary) Q components) corresponding to that angle and radius in a known manner. The fixed radius input r may be selected to be the mean radius of the QAM constellation, which may be predetermined in a known manner from the size and arrangement of the constellation points for the selected size QAM constellation. The I and Q components resulting from this conversion are supplied to the output of the quantizer 116 as the selected constellation point while the quantizer is operating in the octant mode. The polar to rectangular converter 716 may also comprise a lookup table. One skilled in the art will further understand that it is not necessary to have an input terminal for the signal r, if it remains constant, and will also understand that, in an actual implementation, the angle calculating circuit 706 and the polar to rectangular converter 716 may comprise a single eight entry look up table producing the rectangular I and Q coordinates directly corresponding to the Y0, Y1 and Y2 input signals.

Referring again to FIG. 7, the input signal to the quantizer 116, and the output signal from the quantizer 116, are supplied to the carrier recovery circuit 912. In each operating mode of the quantizer 116 (described above), the difference between the values of the input and output signals represents the error between the transmitted symbol and the estimated received symbol. This signal is processed in a known manner in the carrier recovery circuit 912. A control signal is generated in the carrier recovery circuit 912 and is supplied to the derotator 114 to change the phase and amplitude of the QAM signal representing the estimated received symbols to align them with the ideal constellation, also in a known manner.

After the quantizer 116 has passed from operating in the quadrant mode, to operating in the octant mode, and then to operating in the full decision directed mode, as described above, the multiplexer 906 is conditioned to couple decisions from the quantizer 116 to the DFE 910, which, then begins operation as a decision feedback equalizer, rather than as an IIR. In this operating mode, the coefficients of the FFE 902 and DFE 910 track changing channel conditions. The error signal e, from subtractor 914, represents the difference between the complete value of the signal at the quantizer 116 input terminal, representing the received symbol, and the signal at the quantizer 116 output terminal representing the estimated received symbol. The error signal e is coupled to control input terminals of the FFE 902 and DFE 910. The FFE 902 and DFE 910, in response to the error signal e, adjust their coefficients, in a known manner, in an effort to minimize the error signal e.

However, from FIG. 7 it can be seen that the adaptive equalizer 112 is operating on a passband (not derotated) signal, while the quantizer 116 and carrier recovery circuit 912 are operating on a baseband (derotated) signal. In order to allow the adaptive equalizer 112 to properly adjust its coefficients while operating on a signal in the passband, the decisions from the quantizer 116, and the error signal e from the subtractor 914, both of which are baseband signals, are rerotated back into the passband by the operation of the first and second rerotators 916 and 918, respectively. The control signals for the first and second rerotators, 916 and 918, respectively, are derived from the control signal generated by the carrier recovery circuit 912 for the derotator 114. The control signal from the carrier recovery circuit 912 is conjugated by the complex conjugating circuit 920. The conjugated control signal is supplied to the rerotators 916 and 918, which, in response to this conjugated control signal, perform the inverse operation to the derotator 114, and rerotate the decisions from the quantizer 116 and the error signal from the subtractor 914, respectively, back into the passband. Thus, the adaptive equalizer 112 can continue to operate in the passband, while the quantizer 116, carrier recovery circuit 912 and subtractor 914 can continue to operate in the baseband.

It is difficult to switch an adaptive equalizer from operating in the passband during the signal acquisition period, to operating the baseband during the normal operating mode. But in prior arrangements, this was necessary because the decisions which were to be fed back to the DFE portion of the adaptive equalizer during the normal operating mode were in the baseband. The arrangement of the present application provides the advantage of allowing the adaptive equalizer coefficients to be initially converged in the passband, and then allowing it to continue to operate in the passband in a decision feedback mode after the QAM carrier has been acquired. It also isolates the operation of the adaptive equalizer from the operation of the carrier recovery circuit and the quantizer.

The carrier recovery circuit 912 and quantizer 116 described above are arranged for processing a signal containing QAM modulated data. However, one skilled in the art will understand that they may be modified to instead process a signal containing VSB modulated data, and will understand how to modify the carrier recovery circuit 912 and quantizer 116 to properly process such a signal, in a similar manner to that described above, or to controllably process either a signal containing QAM modulated data or one containing VSB modulated data.

Figure 12:
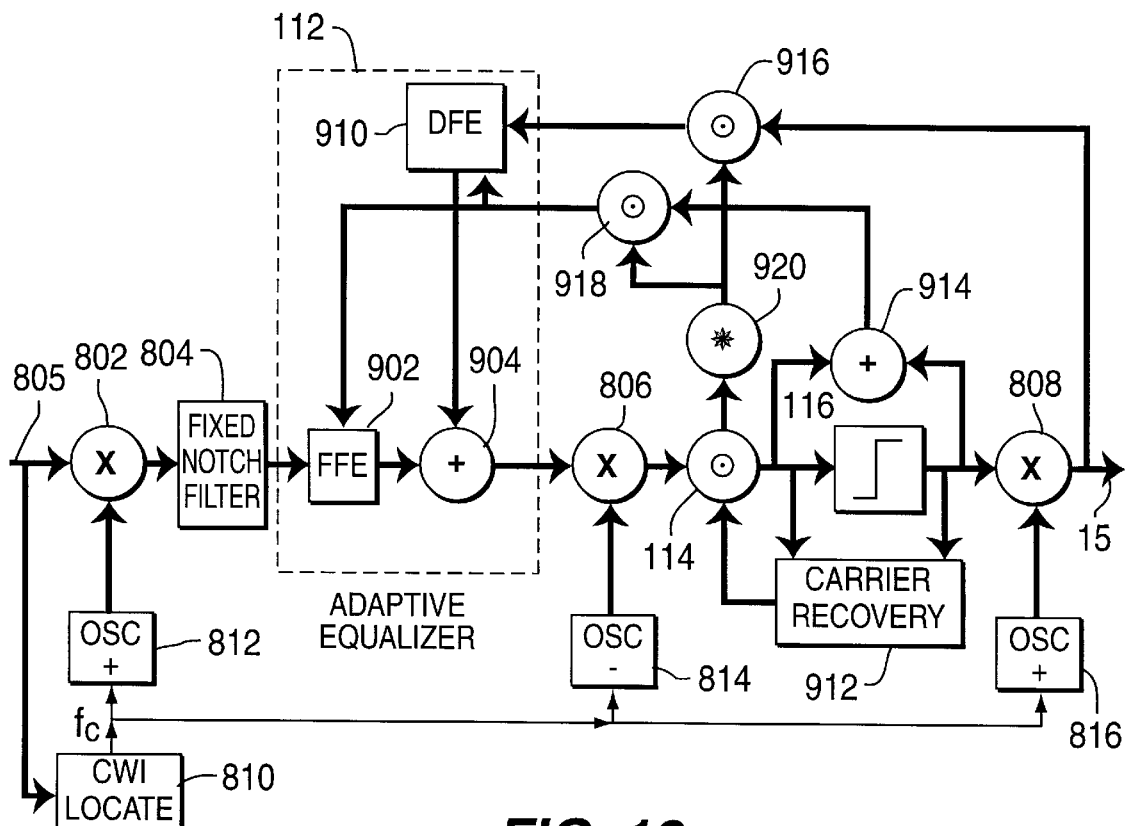
FIG. 12 is a more detailed block diagram of a portion of the digital television receiver illustrated in FIG. 1 for rejecting narrow band continuous wave interference, such as would be generated by analog television signals.

FIG. 12 is a more detailed block diagram of a portion of the digital television receiver illustrated in FIG. 1 for rejecting narrow band continuous wave interference, such as would be generated by analog television signals. An analog television signal, such as an NTSC television signal, which might appear within the bandwidth of the digital television signal, would appear as a narrow band continuous wave interference signal. To prevent the presence of such a signal from degrading the reception of the digital television signal, it must be filtered out, without degrading the remainder of the digital television signal.

According to the present invention, a fixed frequency notch filter is used to filter out the narrow band continuous wave interference signal, and the frequency of the digital television signal is appropriately modulated to place the narrow band signal at the notch frequency of the notch filter. FIG. 12 illustrates an arrangement for cancelling such a narrow band continuous wave signal in this manner. In FIG. 12, an input terminal 805 is coupled to the output terminal of the matched filter/complement 110 (of FIG. 1). The input terminal 805 is coupled to a signal input terminal of a first modulator 802. An output terminal of the first modulator 802 is coupled to an input terminal of a fixed frequency notch filter 804. An output terminal of the notch filter is coupled to the input terminal of the FFE 902. The output terminal of the FFE 902 is coupled to the first input terminal of the signal combiner 904. The output terminal of the signal combiner 904 is coupled to a signal input terminal of a second modulator 806. An output terminal of the second modulator 806 is coupled to the signal input terminal of the derotator 114. The output terminal of the derotator 114 is coupled to the input terminal of the quantizer 116, and to respective first input terminals of the carrier recovery circuit 912 and the subtractor 914. The output terminal of the quantizer 116 is coupled to a signal input terminal of a third modulator 808, and to the respective second input terminals of the carrier recovery circuit 912 and the subtracter 914. An output terminal of the third modulator 808 is coupled to the output terminal 15 and to the signal input terminal of the first rerotator 916. The output terminal of the first rerotator 916 is coupled to the input terminal of the DFE 910. The output terminal of the subtracter 914 is coupled to a signal input terminal of the second rerotator 918. The output terminal of the second rerotator 918 is coupled to respective control input terminals of the DFE 910 and the FFE 902. The output terminal of the carrier recovery circuit 912 is coupled to the control input terminal of the derotator 114, and to the input terminal of the complex conjugating circuit 920. The output terminal of the complex conjugating circuit 920 is coupled to respective control input terminals of the first and second rerotators 916 and 918.

The input terminal 805 is also coupled to an input terminal of a continuous wave interference (CWI) locator 810. An output terminal of the CWI locator 810 is coupled to respective control input terminals of a first, second and third modulating carrier oscillators, 812, 814 and 816. Respective carrier output terminals of the first, second and third oscillators, 812, 814, and 816, are coupled to corresponding carrier signal input terminals of the first, second and third modulators 802, 806 and 808.

The arrangement illustrated in FIG. 12 is similar to that illustrated in FIG. 7. The additional elements illustrated in FIG. 12 are: the notch filter 804; the first, second and third modulators 802, 804 and 808, respectively, the corresponding carrier oscillators 812, 814 and 816; and the CWI locator 810. The remainder of FIG. 12 operates in the same manner as described above, and it will not be described in detail here.

The CWI locator 810, in a manner to be described below, analyzes the band of frequencies containing the digital television signal to detect a continuous wave interference (CWI) signal, and the complex frequency within that band at which such an interference signal resides. The response characteristic of the fixed notch filter 804 has a zero at a predetermined complex frequency. When a CWI signal is located by the CWI Locator 810, it provides a control signal to the first oscillator 812 conditioning it to produce a carrier signal for the first modulator 802 having a frequency which will move the digital television signal in frequency so that the frequency of the CWI signal is placed at the predetermined frequency of the zero in the notch filter 804. In this manner, the notch filter 804 cancels the CWI signal. This signal is then processed in the passband by the adaptive equalizer 112 in the manner described above.

Before the equalized digital television signal is translated to baseband by the derotator 114 (as described above), it is modulated back to its original frequency location. The control signal from the CWI locator 810 is also supplied to the second carrier oscillator 814, which generates a carrier signal for the second modulator 806 so that the equalized digital television signal is moved in frequency back to its original location. The movement in frequency in one direction by the first carrier oscillator and modulator pair, 812 and 802, is signified by the + in the first carrier oscillator 812; and the movement in frequency in the other direction by the second carrier oscillator and modulator pair, 814 and 806, is signified by the − in the second carrier oscillator 814. The + and − are intended to represent only the relative movement in frequency and not to represent an absolute frequency shift direction.

The equalized digital television signal, returned to its original frequency location, is then translated to the baseband by the derotator 114. The derotated signal is then processed by the quantizer 116, which operates in the manner described above to produce a sequence of samples for the utilization circuitry (not shown) at output terminal 15. The carrier recovery circuit 912 and the subtractor 914, also in the manner described above, respectively produce the control signal to control the derotator 114, and the error signal e to control the tracking of the coefficients in the DFE 910 and FFE 920. In addition, the decisions of the quantizer 116 are fed back to the input terminal of the DFE 910. But the adaptive equalizer 112 is operating on the signal as translated in frequency to suppress the CWI signal. In order to properly translate the symbols fed back to the DFE 910, the control signal from the CWI locator 810 is also supplied to the third carrier oscillator 816, which generates a carrier signal for the third modulator 808 so that the decision signal is, again, translated in frequency to the frequency selected to suppress the CWI. This is signified by the + in the third carrier oscillator 816. One skilled in the art will recognize that the first and third oscillators, 812 and 816, respectively, produce identical carrier signals, and will understand that a single oscillator may be used, in a preferred embodiment, to provide both signals.

The DFE 910 includes a pole at the frequency of the notch in the notch filter 804. This pole compensates for the zero introduced by the notch filter but does not increase the noise because the input to the DFE are decisions from the quantizer 116, which are inherently noise free. Because the input signal to the DFE is noise free, the pole cannot increase the noise.

The CWI locator 810 detects the presence and frequency of a CWI signal by continually calculating, in a known manner, a series of FFTs on its input signal. A running average of the magnitudes in this series of FFTs is maintained. Then, for each bin in the FFT, the magnitude of the signal of that bin is compared to the average magnitude of all the bins. If the magnitude of a bin exceeds the average by a predetermined amount, the CWI locator detects the presence of a CWI signal, and the frequency represented by that bin is the frequency at which the CWI signal is assumed to reside. The control signal generated by the CWI locator 810 for the first, second and third carrier oscillators, 812, 814 and 816, respectively, conditions those oscillators to produce carrier signals having the appropriate frequencies to cancel the CWI signal using the fixed notch filter 804.

The present application has been described in a digital television receiver embodiment. One skilled in the art, however, will understand that the principles of the present invention are equally applicable to any receiver in a digital transmission system transmitting QAM or VSB modulated data.

What is claimed is:

1. Apparatus for generating timing signals from digital television signals, comprising:
   a filter/complement for filtering said digital television signals having a first output terminal producing a low-pass filtered signal, and a second output terminal producing a high-pass filtered signal complementary to the low-pass filtered signal; and
   a sample clock generating circuit, coupled to the second output terminal of the filter/complement, for producing a sample clock signal responsive to the high-pass filtered signal; wherein
   the sample clock generating circuit is a band edge timing recovery circuit; and
   the high-pass filtered signal is a complex signal which contains a positive frequency component and a negative frequency component, and the sample clock generating circuit comprises:
   a first band edge filter, coupled to the filter/complement, for extracting the positive frequency component from the high-pass filtered signal;
   a second band edge filter, coupled to the filter/complement, for extracting the negative frequency component from the high-pass filtered signal;
   a complex conjugating circuit coupled to one of the first and second filters;
   a multiplier having a first input terminal coupled to the other one of the first and second filters, and a second input terminal coupled to the complex conjugating circuit; and
   a serial connection of a phase detector, loop filter and voltage controlled oscillator coupled to the multiplier and producing the sample clock signal.

2. The apparatus of claim 1 wherein the first and second band edge filters are Hilbert filters.

3. The apparatus of claim 1 wherein the filter/complement is a matched filter/complement in which the filter characteristic is matched to a transmit pulse shape of the digital television signals.

4. The apparatus of claim 3 wherein the filter characteristic is a root raised cosine filter.

5. The apparatus of claim 1 wherein said digital television signals comprise quadrature amplitude modulated (QAM) and vestigial sideband (VSB) signals.

6. Apparatus for generating timing signals from digital television signals, comprising:
   a filter/complement for filtering said digital television signals having a first output terminal producing a low-pass filtered signal, and a second output terminal producing a high-pass filtered signal complementary to the low-pass filtered signal; and
   a sample clock generating circuit, coupled to the second output terminal of the filter/complement, for producing a sample clock signal responsive to the high-pass filtered signal said sample clock generating circuit comprising a band edge timing recovery circuit;
   wherein the high-pass filtered signal is a simple real signal which contains a positive frequency component and a negative frequency component, and the sample clock generating circuit comprises:
   a first band edge filter, coupled to the filter/complement, for extracting one of the positive and negative frequency components from the high-pass filtered signal;
   a complex conjugating circuit, coupled to the filter/complement;
   a second band edge filter, coupled to the complex conjugating circuit, for extracting the other one of the positive and negative frequency components from the high-pass filtered signal;

a first phase detector, coupled to the first band edge filter;

a second phase detector, coupled to the second band edge filter;

a subtractor, having a minuend input terminal coupled to the first phase detector, and a subtrahend input terminal coupled to the second phase detector; and a series connection of a loop filter and a voltage controlled oscillator coupled to a signal combiner and producing the sample clock signal.

7. The apparatus of claim 6 wherein the first and second band edge filters are Hilbert filters.

8. The apparatus of claim 6 wherein said digital television signals comprise quadrature amplitude modulated (QAM) and vestigial sideband (VSB) signals.

9. The apparatus of claim 6 wherein the filter/complement is a matched filter/complement in which the filter characteristic is matched to a transmit pulse shape of the digital television signal.

10. The apparatus of claim 9 wherein the filter characteristic is a root raised cosine filter.

11. Apparatus for generating timing signals from digital television signals, comprising:

a filter/complement for filtering said digital television signals having a first output terminal producing a low-pass filtered signal, and a second output terminal producing a high-pass filtered signal complementary to the low-pass filtered signal; and a sample clock generating circuit, coupled to the second output terminal of the filter/complement, for producing a sample clock signal responsive to the high-pass filtered signal, said sample clock generating circuit comprising a band edge timing recovery circuit; wherein:

the second output terminal of the filter/complement comprises a real component signal output terminal and an imaginary component signal output terminal, and the high-pass filtered signal contains a positive frequency component and a negative frequency component; and the sample clock generating circuit comprises:

a first band edge filter, having a real signal input terminal coupled to the real signal output terminal of the filter/complement, and an imaginary signal input terminal, for extracting one of the positive and negative frequency components from the high-pass filtered signal;

a first multiplexer, having a first data input terminal coupled to the imaginary component signal output terminal of the filter/complement, a second data input terminal coupled to a source of a zero-valued signal, an output terminal coupled to the imaginary signal input terminal of the first band edge filter, and a control input terminal;

a controllable I/Q swapper circuit, having respective real and imaginary signal input terminals coupled to corresponding output terminals of the filter/complement, respective real and imaginary signal output terminals, and a control input terminal;

a second band edge filter, having a real signal input terminal coupled to the real signal output terminal of the controllable I/Q swapper circuit, and an imaginary signal input terminal, for extracting the other one of the positive and negative frequency components from the high-pass filtered signal;

a second multiplexer, having a first data input terminal coupled to the imaginary signal output terminal of the controllable I/Q swapper circuit, a second data input terminal coupled to the source of a zero-valued signal, an output terminal coupled to the imaginary signal input terminal of the second band edge filter, and a control input terminal;

a complex conjugating circuit, coupled to the second band edge filter;

a complex multiplier, having a first input terminal coupled to the first band edge filter, and a second input terminal coupled to the complex conjugating circuit;

a complex multiplexer, having a first input terminal coupled to the first band edge filter, a second input terminal coupled to the complex multiplier, and a control input terminal;

a first phase detector, coupled to the complex multiplexer;

a second phase detector, coupled to the second band edge filter;

a third multiplexer, having a first data input terminal coupled to the second phase detector, a second data input terminal coupled to the source of a zero-valued signal, and a control input terminal;

a subtractor, having a minuend input terminal coupled to the first phase detector, and a subtrahend input terminal coupled to the third multiplexer;

a series connection of a loop filter and a voltage controlled oscillator coupled to a signal combiner and producing the sample clock signal; and a source of control signal having one of a first and second state, coupled to respective control input terminals of the controllable I/Q swapper circuit, the first, second and third multiplexers, and the complex multiplexer; wherein:

when the control signal is in the first state:
the first multiplexer is conditioned to couple the signal from the filter/complement to the first band edge filter;
the controllable I/Q swapper circuit is conditioned to pass the signal from the filter/complement to its respective output terminals unchanged;
the second multiplexer is conditioned to couple the signal from the controllable I/Q swapper circuit to the second band edge filter;
the complex multiplexer is conditioned to couple the signal from the complex multiplier to the first phase detector; and
the third multiplexer is conditioned to couple the signal from the zero-valued signal source to the subtractor; and when the control signal is in the second state:
the first multiplexer is conditioned to couple the signal from the zero-valued signal source to the first band edge filter;
the controllable I/Q swapper circuit is conditioned to pass swapped I/Q data signals from the filter/complement to its respective output terminals;
the second multiplexer is conditioned to couple the signal from the zero-valued signal source to the second band edge filter;
the complex multiplexer is conditioned to couple the signal from the first band edge filter to the first phase detector; and
the third multiplexer is conditioned to couple the signal from the second phase detector to the subtractor.

12. The apparatus of claim 11 wherein said digital television signals comprise quadrature amplitude modulated (QAM) and vestigial sideband (VSB) signals.

13. The apparatus of claim 11 wherein the filter/complement is a matched filter/complement in which the filter characteristic is matched to a transmit pulse shape of the digital television signal.

14. The apparatus of claim 13 wherein the filter characteristic is a root raised cosine filter.

15. In a receiver for television signals, apparatus for sampling said television signals comprising:

an analog-to-digital (A/D) converter for periodically sampling said television signals in response to a timing signal to produce sampled television signals;

a quadrature demodulator, coupled to said A/D converter, for demodulating said sampled television signals into an in-phase component and a quadrature component;

a first matched filter/complement, coupled to said quadrature demodulator, for filtering said in-phase component having a first output terminal producing an in-phase low pass filtered signal, and a second output terminal having an in-phase high pass filtered signal complementary to the in-phase low pass filtered signal;

a second matched filter/complement, coupled to said quadrature demodulator, for filtering said quadrature component having a first output terminal producing a quadrature low pass filtered signal, and a second output terminal having a quadrature high pass filtered signal complementary to the quadrature low pass filtered signal; and a timing signal generating circuit, coupled to the second output terminals of the first and second filter/complements, for producing the timing signal for said A/D converter.

16. The apparatus of claim 15 wherein said television signals include quadrature amplitude modulated (QAM) and vestigial sideband (VSB) signals.

17. The apparatus of claim 16 wherein said timing signal generating circuit comprises:

a complex signal generator, coupled to said first and second filter/complements, for forming a complex signal from said in-phase high pass filtered signal and said quadrature high pass filtered signal, the complex signal contains a positive frequency component and a negative frequency component;

a first band edge filter, coupled to the complex signal generator, for extracting the positive frequency component from the complex signal;

a second band edge filter, coupled to the complex signal generator, for extracting the negative frequency component from the complex signal;

a complex conjugating circuit coupled to one of the first and second filters;

a multiplier having a first input terminal coupled to the other one of the first and second filters, and a second input terminal coupled to the complex conjugating circuit; and a serial connection of a phase detector, loop filter and voltage controlled oscillator coupled to the multiplier and producing the timing signal.

18. The apparatus of claim 17 wherein the first and second band edge filters are Hilbert filters.

19. The apparatus of claim 15 wherein:

the second output terminal of the first matched filter/complement comprises a real component signal output terminal and the second output terminal of the second matched filter/complement comprises an imaginary component signal output terminal, and the in-phase and quadrature high-pass filtered signals each contain a positive frequency component and a negative frequency component; and the timing signal generating circuit comprises:

a first band edge filter, having a real signal input terminal coupled to the real signal output terminal of the first matched filter/complement, and an imaginary signal input terminal, for extracting one of the positive and negative frequency components from the quadrature high-pass filtered signal;

a first multiplexer, having a first data input terminal coupled to the imaginary component signal output terminal of the second matched filter/complement, a second data input terminal coupled to a source of a zero-valued signal, an output terminal coupled to the imaginary signal input terminal of the first band edge filter, and a control input terminal;

a controllable I/Q swapper circuit, having respective real and imaginary signal input terminals coupled to corresponding output terminals of the first and second matched filter/complements, respective real and imaginary signal output terminals, and a control input terminal;

a second band edge filter, having a real signal input terminal coupled to the real signal output terminal of the controllable I/Q swapper circuit, and an imaginary signal input terminal, for extracting the other one of the positive and negative frequency components from the quadrature high-pass filtered signal;

a second multiplexer, having a first data input terminal coupled to the imaginary signal output terminal of the controllable I/Q swapper circuit, a second data input terminal coupled to the source of a zero-valued signal, an output terminal coupled to the imaginary signal input terminal of the second band edge filter, and a control input terminal;

a complex conjugating circuit, coupled to the second band edge filter;

a complex multiplier, having a first input terminal coupled to the first band edge filter, and a second input terminal coupled to the complex conjugating circuit;

a complex multiplexer, having a first input terminal coupled to the first band edge filter, a second input terminal coupled to the complex multiplier, and a control input terminal;

a first phase detector, coupled to the complex multiplexer;

a second phase detector, coupled to the second band edge filter;

a third multiplexer, having a first data input terminal coupled to the second phase detector, a second data input terminal coupled to the source of a zero-valued signal, and a control input terminal;

a subtractor, having a minuend input terminal coupled to the first phase detector, and a subtrahend input terminal coupled to the third multiplexer;

a series connection of a loop filter and a voltage controlled oscillator coupled to the subtractor and producing the sample clock signal; and a source of control signal having one of a first and second state, coupled to respective control input terminals of the controllable I/Q swapper circuit, the first, second and third multiplexers, and the complex multiplexer; wherein:

when the control signal is in the first state:

the first multiplexer is conditioned to couple the signal from the second matched filter/complement to the first band edge filter;

the controllable I/Q swapper circuit is conditioned to pass the signal from the first and second matched filter/complements to its respective output terminals unchanged;

the second multiplexer is conditioned to couple the signal from the controllable I/Q swapper circuit to the second band edge filter;

the complex multiplexer is conditioned to couple the signal from the complex multiplier to the first phase detector; and the third multiplexer is conditioned to couple the signal from the zero-valued signal source to the signal combiner; and when the control signal is in the second state:

the first multiplexer is conditioned to couple the signal from the zero-valued signal source to the first band edge filter;

the controllable I/Q swapper circuit is conditioned to pass swapped I/Q data signals from the first and second matched filter/complements to its respective output terminals;

the second multiplexer is conditioned to couple the signal from the zero-valued signal source to the second band edge filter;

the complex multiplexer is conditioned to couple the signal from the first band edge filter to the first phase detector; and the third multiplexer is conditioned to couple the signal from the second phase detector to the signal combiner.

20. The apparatus of claim 15 wherein the first and second filter/complements are matched filter/complements in which the filter characteristic is matched to a transmit pulse shape of the television signals.

21. The apparatus of claim 20 wherein the filter characteristic is a root raised cosine filter.

* * * * *